United States Patent [19]

Bockett-Pugh

[11] Patent Number: 4,499,419
[45] Date of Patent: Feb. 12, 1985

[54] METHODS AND APPARATUS FOR ASSESSING THE QUALITY OF LOGIC SIGNALS

[75] Inventor: Charles Bockett-Pugh, Bracknell, England

[73] Assignee: Schlumberger Electronics (U.K.) Ltd., Farnborough, England

[21] Appl. No.: 273,536

[22] Filed: Jun. 15, 1981

[30] Foreign Application Priority Data

Jun. 23, 1980 [GB] United Kingdom ............... 8020424

[51] Int. Cl.³ ................. G01R 19/00; G01R 29/00
[52] U.S. Cl. ................. 324/102; 324/77 A; 324/133
[58] Field of Search ............ 324/102, 103 P, 103 R, 324/133, 77 A, 72.5

[56] References Cited

U.S. PATENT DOCUMENTS

| | | | |
|---|---|---|---|
| 2,752,589 | 6/1956 | DeLong, Jr. | 324/103 R |
| 2,884,085 | 4/1959 | von Wittern et al. | 324/103 R |
| 3,054,960 | 9/1962 | Pearlman | 324/103 R |

FOREIGN PATENT DOCUMENTS

| | | |
|---|---|---|
| 1273428 | 5/1972 | United Kingdom . |
| 1293976 | 10/1972 | United Kingdom . |
| 1447291 | 8/1976 | United Kingdom . |
| 1533830 | 11/1978 | United Kingdom . |

*Primary Examiner*—Ernest F. Karlsen
*Attorney, Agent, or Firm*—Dale Gaudier

[57] ABSTRACT

Departure of a logic signal from the ranges of signal values corresponding to defined logic levels is monitored by comparing the logic signal with the boundary values of these ranges. Provided the logic signal between transitions is below the lower threshold (14) or above the upper threshold (12), a NOR gate (16) and a D-type bistable circuit (18) open an AND gate (22) to enable a counter (24) to count 10 MHz clock pulses. If the logic signal is between the thresholds, the AND gate disables the counter. The four most significant digits of the total number of clock pulses actually counted after 1,000,000 have been supplied is displayed, giving an indication of the percentage of time for which the logic signal has a value corresponding to a defined logic level. As an alternative, the output signal of the NOR gate (16) can be inverted (26) and supplied to a moving-coil or digital voltmeter (30).

8 Claims, 4 Drawing Figures

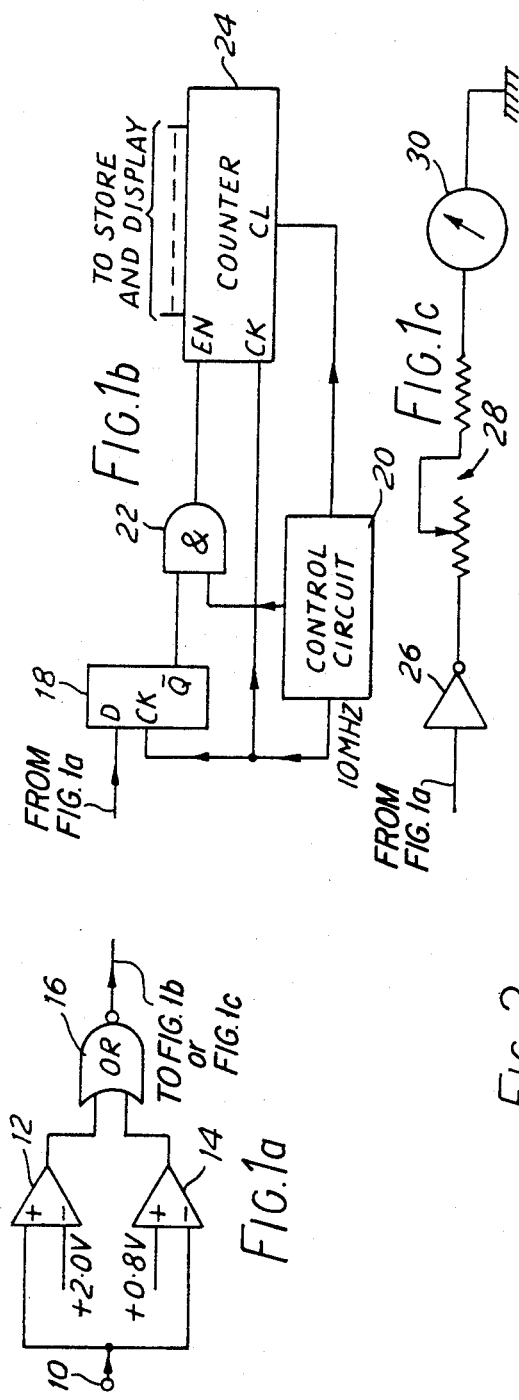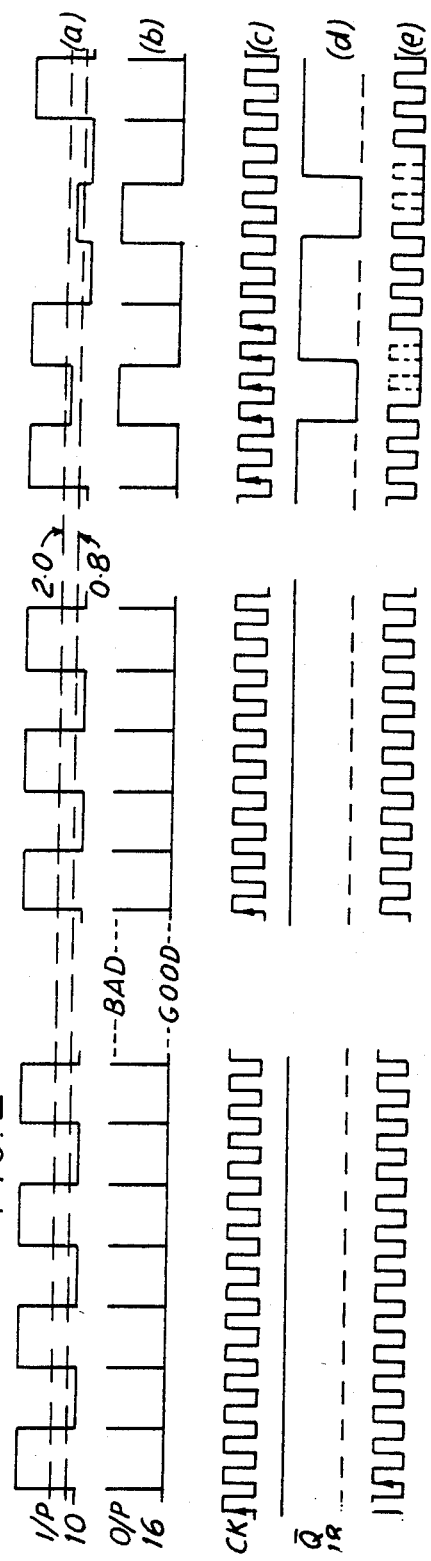

METHODS AND APPARATUS FOR ASSESSING THE QUALITY OF LOGIC SIGNALS

This invention relates to methods and apparatus for assessing the quality of logic signals.

The widespread use of electronic digital logic circuitry has given rise to the need for effective techniques of testing the correct operation of such circuitry. Such techniques commonly involve testing the individual circuit components for correct functioning, whereas improper operation of a circuit can arise from a variety of causes other than individual circuit component malfunction. For example, the specifications of the various logic families include definitions of the electrical voltage levels corresponding to the different logic states. Thus, in the case of the so called TTL (transistor transistor logic) family, the logic 0 input state is defined as any voltage between 0 volts and 0.8 volts, and the logic 1 input state is defined as any voltage between 2.0 volts and 5.0 volts. The logic state represented by a signal lying between 0.8 volts and 2.0 volts is undefined, so the significance which will be assigned to such a signal by any individual logic circuit cannot be predicted with certainty. Thus, any signal which spends an appreciable amount of time in the undefined range between 0.8 volts and 2.0 volts, rather than in either of the two defined ranges, is likely to cause erratic and unpredictable operation of the circuitry. It would therefore be advantageous to be able to assess the quality of a logic signal, that is to assess whether a logic signal always has values lying within one or other of the defined signal ranges (ignoring the brief periods of transition between the two defined ranges), or whether it spends a significant proportion of time within the range of signal values not corresponding to a defined logic state.

According to one aspect of this invention there is provided a method of assessing the quality of a logic signal, comprising the steps of:
generating a control signal indicative of whether a logic signal lies within a range of signal values not corresponding to a defined logic state; and
integrating said control signal with respect to time, whereby the magnitude of the integral is indicative of the quality of the logic signal.

According to another aspect of this invention there is provided apparatus for assessing the quality of a logic signal, comprising:
means arranged to generate a control signal indicative of whether a logic signal lies within a range of signal values not corresponding to a defined logic state; and
means arranged to integrate said control signal with respect to time, whereby the magnitude of the integral is indicative of the quality of the logic signal.

A method and apparatus in accordance with this invention for assessing the quality of a logic signal will now be described, by way of example, with reference to the accompanying drawing, in which:

FIGS. 1a, 1b, and 1c show two possible versions of the apparatus: and

FIG. 2 shows waveforms occurring at various points in one version of the apparatus of FIG. 1.

Referring to FIG. 1a, a logic signal whose quality is to be assessed is applied via an input 10 to the non-inverting input of a first high speed analogue comparator 12, and to the inverting input of a second such comparator 14. The inverting input of the comparator 12 receives a threshold signal having a value of +2.0 volts, and the non-inverting input of the comparator 14 receives a threshold signal having a value of +0.8 volts. The outputs of the comparators 12 and 14 are coupled to the inputs of a NOR-gate 16. Thus as long as the value of the logic signal remains outside the range 0.8 to 2.0 volts, one or other of the comparators 12 and 14 will supply a logic 1 signal to the respective input of the NOR-gate 16, which will thus supply a logic 0 output. However, if the value of the logic signal falls within this range, the output of the NOR-gate 16 will assume a logic 1 level, indicative of a bad level in the input logic signal.

In a first version of the apparatus, shown in FIG. 1b, the output of the NOR-gate 16 is coupled to the D input of a D-type flip-flop 18. The clock input of this flip-flop 18 receives a 10 MHz clock pulse train from a control circuit 20, and the $\overline{Q}$ output of the flip-flop 18 is connected to one input of a two input AND-gate 22. The other input of the AND-gate 22 is controlled by the control circuit 20, while the output of the AND-gate 22 is coupled to the enable input EN of a counter 24. A clock input CK of the counter 24 receives the 10 MHz clock pulses from the control circuit 20, and a clear input CL is also controlled by the control circuit 20. The outputs of the counter 24 are coupled to a display arrangement (not shown), involving, for example, a microprocessor, which could also constitute the control circuit 20.

In operation, the control circuit 20 first clears the counter 24, and then opens the gate 22 for a period of 2.5 milliseconds. During this period, the counter 24 is enabled to count the 10 MHz clock pulses at its clock input CK so long as it receives an enabling signal via the AND-gate 22 from the $\overline{Q}$ output of the D-type flip flop 18. As will be described below, this occurs so long as the value of the input logic signal remains within one of the ranges of signal values corresponding to a defined logic state. At the end of the 2.5 millisecond gate period, the count (with a maximum value of 25,000) in the counter 24 is transferred to a store associated with the display. The counter 24 is then cleared, and the procedure repeated for a total of 40 gate periods, the count at the end of each gate period being aggregated in the store. Thereafter the four most significant digits of the aggregate count (maximum value 1 million) are displayed, giving a maximum display of 100.0. After a pause of 100 milliseconds the entire cycle is repeated. The gate signal supplied to the AND-gate 22 by the control circuit 20 can conveniently comprise one half cycle of a 200 Hz square wave, in which case ten readings can be taken every 3 seconds.

So long as the input signal at the terminal 10 has values in one of the two ranges corresponding to defined logic states (disregarding transitions between these states), the output of the NOR-gate 16 will remain at logic 0—see the left hand portions of FIGS. 2a and 2b. Thus the positive edge of each successive clock pulse (see FIG. 2c) will cause the $\overline{Q}$ output of the flip flip 18 to remain at logic 1 (see FIG. 2d). This in turn will enable the counter 24 via the AND-gate 22, so the count in the counter 24 will be incremented by the positive edge of the next following clock pulse. Even if a clock pulse coincides with a transition of the input logic signal between the two logic states, as shown in the centre portion of FIG. 2, the transient pulse on the output of the NOR-gate 16 will have no effect because it will be present for less than the data set-up time on the D input of the flip flop 18 (that is the minimum time required for data present on the input of a flip flop to be transferred to the output).

However, if the logic signal at the input 10 spends appreciable periods of time in the range of signal values which do not correspond to a defined logic state, as indicated schematically in the right hand portion of FIG. 2, the contemporaneous clock pulses will cause the resultant logic 1 signal at the output of the NOR-gate 16 to be transferred with inversion to the $\overline{Q}$ output of the flip flop 18. The logic 0 at the $\overline{Q}$ output will in turn disable the counter 24, thereby preventing some of the following clock pulses (indicated in dotted lines in FIG. 2e) from incrementing the counter 24. Thus, at the end of the reading, the aggregate count in the store will be less than the possible maximum of 1 million, and the value shown by the display will be less than the possible maximum of 100.0. The displayed value will indicate the proportion of time, as a percentage, for which the input logic signal remained within the ranges of signal values corresponding to defined logic states.

Thus, a reading of 100% would indicate that the input signal values were remaining within the ranges corresponding to defined logic states, and are therefore unlikely to be the cause of a fault, whereas a reading significantly less than 100% would indicate that the input logic signal was spending a substantial amount of time in the range of signal values not corresponding to a defined logic state, and would suggest that this logic signal could be involved in a fault. Such an indication is of particular value in the location of erratic or intermittent faults.

FIG. 1c illustrates an alternative version of the apparatus, in which the output of the NOR-gate 16 is coupled via an inverter 26, and a variable resistance chain 28, to a 1 milliamp moving coil meter 30. The current supplied to the meter 30 is calibrated by means of the resistance chain 28, so that for a good input signal, which does not spend any appreciable time in the range of signal values not corresponding to a defined logic state, the meter 30 reads 100%. The meter 30 acts as a low pass filter to display the mean value of the output signal of the NOR-gate 16, and thus displays the percentage of time for which the input logic signal remains within the ranges of signal values corresponding to defined logic states. The accuracy of the indication is limited by the resolution of the meter 30, and can be improved by substituting a digital voltmeter together with reference voltage limiting on the output of the NOR-gate 16.

The thresholds supplied to the comparators 12 and 14 could be +2.4 volts and +0.5 volts respectively (the standard limiting output voltages for logic 1 and logic 0 respectively), but the values shown in FIG. 1a are preferred, since they allow a better noise margin in the input stage of the apparatus.

I claim:

1. A method of assessing the quality of a logic signal, comprising the steps of:
   generating a first threshold signal corresponding to a lower limiting value below which said logic signal represents a first defined logic state;
   generating a second threshold signal corresponding to an upper limiting value above which said logic signal represents a second defined logic state;
   comparing said logic signal with said first threshold signal and generating an output signal indicative of whether said logic signal is below said lower limiting value;
   comparing said logic signal with said second threshold signal and generating an output signal indicative of whether said logic signal is above said upper limiting value;
   combining said output signals, to generate a control signal indicative of whether said logic signal lies within a range of signal values, between said lower and upper limiting values, not corresponding to any defined logic state; and
   integrating said control signal with respect to time, whereby the magnitude of the integral is indicative of the quality of the logic signal.

2. A method according to claim 1, wherein said integrating step comprises the steps of:
   supplying clock pulses at a predetermined rate; and
   counting said clock pulses in accordance with said control signal during a period of predetermined duration.

3. A method according to claim 2, wherein said control signal is arranged to cause said clock pulses to be counted when said logic signal is below said lower limiting value or above said upper limiting value.

4. A method according to claim 1, wherein said integrating step comprises supplying a current in accordance with said control signal to current measuring apparatus.

5. Apparatus for assessing the quality of a logic signal, comprising:
   means for generating a first threshold signal corresponding to a lower limiting value below which said logic signal represents a first defined logic state;
   means for generating a second threshold signal corresponding to an upper limiting value above which said logic signal represents a second defined logic state;
   first comparison means receiving said logic signal and coupled to said first signal generating means, for comparing said logic signal with said first threshold signal and generating an output signal indicative of whether said logic signal is below said lower limiting value;
   second comparison means receiving said logic signal and coupled to said second signal generating means, for comparing said logic signal with said second threshold signal and generating an output signal indicative of whether said logic signal is above said upper limiting value;
   means coupled to said first and second comparison means for combining the output signals thereof, to generate a control signal indicative of whether said logic signal lies within a range of signal values, between said lower and upper limiting values, not corresponding to any defined logic state; and
   means coupled to said control signal generating means for integrating said control signal with respect to time, whereby the magnitude of the integral is indicative of the quality of the logic signal.

6. Apparatus according to claim 5, wherein said integrating means comprises:
   means arranged to supply clock pulses at a predetermined rate; and
   means arranged to count said clock pulses in accordance with said control signal during a period of predetermined duration.

7. Apparatus according to claim 6, wherein said control signal is arranged to cause said counting means to count said clock pulses when said logic signal is below said lower limiting value or above said upper limiting value.

8. Apparatus according to claim 5, wherein said integrating means comprises:
   means arranged to supply a current in accordance with said control signal; and current measuring apparatus.

* * * * *